United States Patent
Yasuda et al.

[11] Patent Number: 5,977,709
[45] Date of Patent: Nov. 2, 1999

[54] MERCURY LAMP OF THE SHORT ARC TYPE

[75] Inventors: Yukio Yasuda; Masanori Sugihara, both of Himeji, Japan

[73] Assignee: Ushiodenki Kabushiki Kaisha, Tokyo, Japan

[21] Appl. No.: 09/020,282

[22] Filed: Feb. 9, 1998

[30] Foreign Application Priority Data

Feb. 7, 1997 [JP] Japan ................................ 9-038606

[51] Int. Cl.⁶ .................................................. F01J 61/06
[52] U.S. Cl. ........................ 313/633; 313/184; 313/630
[58] Field of Search ..................... 313/630, 633, 313/311

[56] References Cited

U.S. PATENT DOCUMENTS

| | | | |
|---|---|---|---|
| 3,548,242 | 12/1970 | Ayotte et al. ............................ | 313/630 |
| 3,621,322 | 11/1971 | Rehmet et al. . | |
| 4,881,009 | 11/1989 | Passmoree ............................. | 313/633 |
| 5,081,396 | 1/1992 | Schneider et al. ....................... | 313/630 |
| 5,447,763 | 9/1995 | Gehlke ................................. | 313/633 |
| 5,654,606 | 8/1997 | Weijtens et al. ........................ | 313/630 |
| 5,744,905 | 4/1998 | Mehrota et al. ........................ | 313/633 |
| 5,847,498 | 12/1998 | Mehrotra et al. ....................... | 313/633 |

FOREIGN PATENT DOCUMENTS 0 715 339   6/1996   European Pat. Off. .

OTHER PUBLICATIONS

Patent Abstracts of Japan, vol. 014, No. 584 (E–1018), Dec. 27, 1990 & JP 02 256150 A (Ushio Inc.) Oct. 16, 1990 * Abstract *.

Patent Abstracts of Japan, vol. 095, No. 008, Sep. 29, 1995 & JP 07 122234 A (Matsushita Electric Ind. Co. Ltd.), May 12, 1995 * Abstract *.

*Primary Examiner*—Vip Patel
*Assistant Examiner*—Matthew J Gerike
*Attorney, Agent, or Firm*—Sixbey, Friedman, Leedom & Ferguson; David S. Safran

[57] ABSTRACT

A mercury lamp of the short arc type with a high degree of maintenance of irradiance is achieved in a mercury lamp of the short arc type by the cathode containing thorium oxide and having a tungsten carbide layer on its surface except at tip end area, by at least one of the cathode or anode being provided with metallic tantalum, and by the condition $1.56 \leq VT/SC$ being satisfied, where SC is the area of the tungsten carbide layer (cm²) and VT is the volume of the metallic tantalum (mm³). Alternatively, a high degree of maintenance of irradiance can be achieved in a mercury lamp of the short arc type by the condition $0.043 \leq VT/VW$ being satisfied, where VW is the volume of the anode (cm³) and VT is the volume of the tantalum in the lamp bulb (mm³).

9 Claims, 4 Drawing Sheets

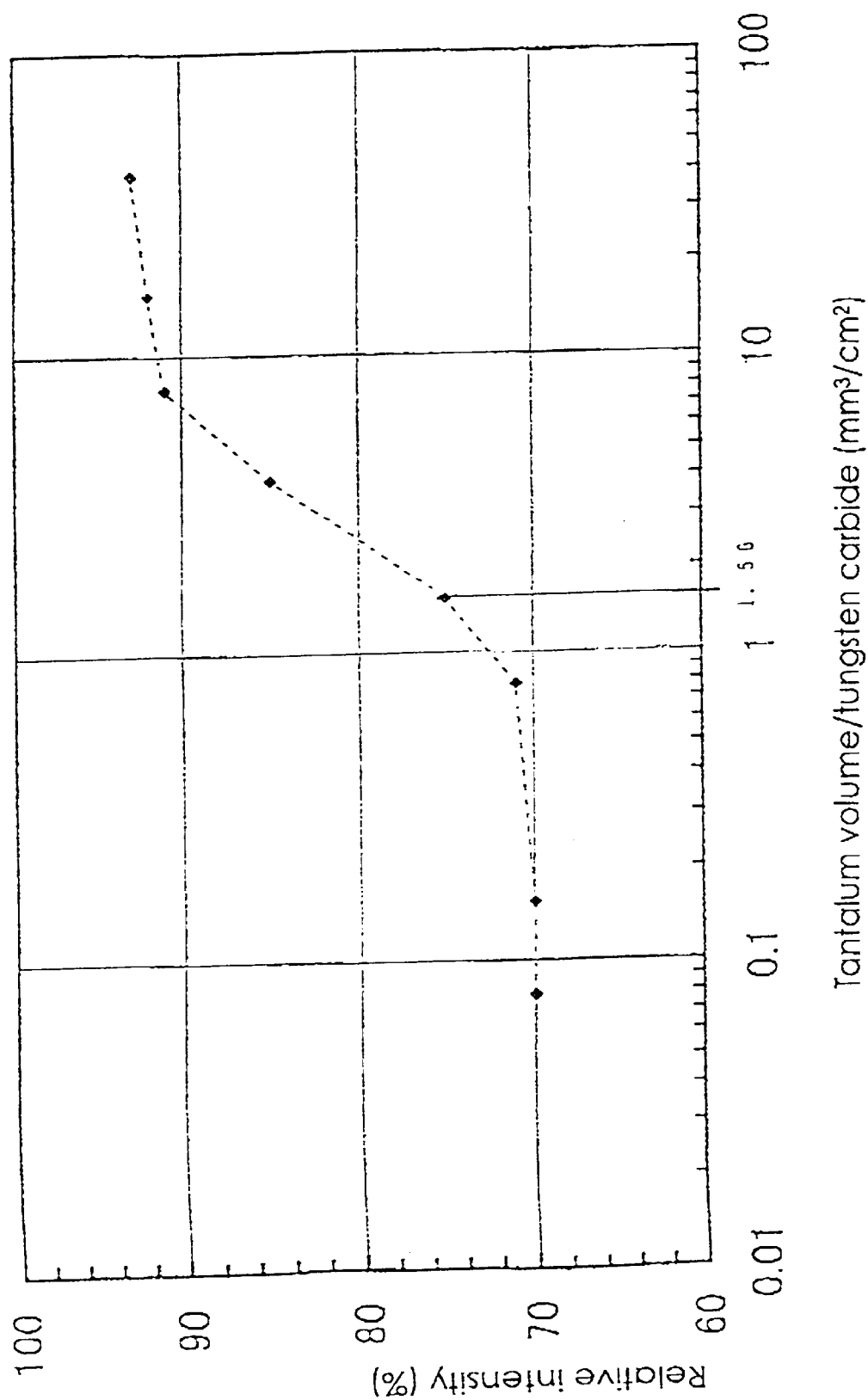

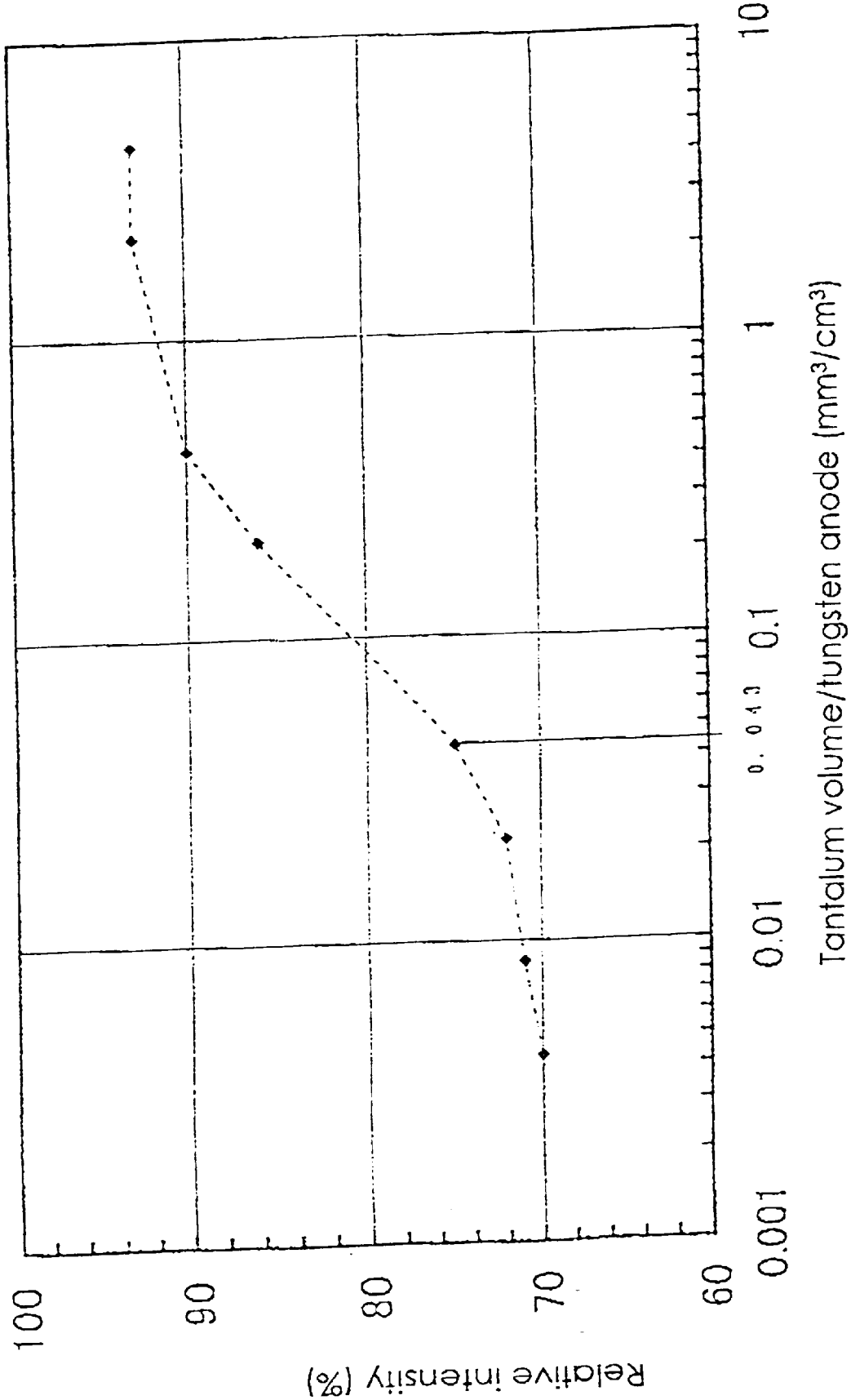

MERCURY LAMP OF THE SHORT ARC TYPE

BACKGROUND OF THE INVENTION

1. Field of the Invention

The invention relates to a mercury lamp of the short arc type which is used for a semiconductor exposure device and which exhibits only minor changes of the radiation efficiency.

2. Description of the Related Art

In the exposure process in the production of semiconductors, a mercury lamp of the short arc type has recently been used which emits UV light with a primary wavelength of 365 nm (hereinafter called "i-line light"). Since the degree of integration of integrated semiconductor circuits increases each year, accordingly there is a greater and greater demand for image resolution during exposure. Furthermore, due to the increase in the size of the exposure surface as a result of enlargement of the wafer aperture, or due to the modified illumination technique which is used to achieve high image resolution, there is a demand for an increase in the amount of UV light radiation from the light source.

An increase of irradiance of the i-line light can be achieved by increasing the electrical input power for the lamp. However, an increase of electrical input power causes an increase in the inflowing amount of energy to the electrodes, and thus, a rise in the electrode temperature; this increases vaporization of the electrode material and the impurities contained therein with resultant damage to the electrodes and blackening of the bulb. To reduce the electrode temperature, there is a process for increasing the electrode dimensions. This increase of the electrode dimensions, however, causes an increase in the amount of carbon which the electrodes contain as impurities.

Generally, gaseous contamination, such as oxygen or the like, which is present in the bulb reacts with the tungsten which comprises the electrodes. This yields tungsten oxide or tungsten as a compound with a low melting point. It is well recognized that this tungsten oxide or the like causes deformation of the electrodes in itself and vaporization of the electrode material because it has a lower melting point than tungsten.

The gaseous contamination in the bulb was therefore eliminated in a conventional mercury lamp by using titanium, zirconium, tantalum and the like as a getter. In this way, gaseous contamination, such as oxygen or the like, could be advantageously eliminated by using the above described getter. However, with respect to the carbon present in the bulb, it has not yet been sufficiently clarified how it behaves in a high temperature range of at least a thousand and some hundred degrees Celsius and what capacity the above described getter has.

Here, the tungsten anode conventionally contains a few ppm of carbon. During operation of the lamp, the anode is exposed to a high temperature. Therefore, there are cases in which the carbon contained in this anode sprays in the emission space in the bulb during lamp operation. When the sprayed carbon is adsorbed on the area of the anode or the cathode of tungsten which comes into contact with the arc, tungsten carbide is formed which has a low melting point. Here, vaporization from this region is accelerated.

On the other hand, in the cathode, conventionally thorium oxide with a proportion of a few % by weight is dispersed to simplify electron emission. Furthermore, on the outer surface of the cathode, a layer of tungsten carbide (carbide layer) is formed. This is because the thorium oxide contained in the cathode is reduced and becomes metallic thorium, and in this way, electron emission is simplified.

If, however, the layer of tungsten carbide located on the outer surface of the cathode is exposed to a high temperature during operation of the lamp, carbon from this layer of tungsten carbide vaporizes. This carbon floats in the emission space in the bulb and can be deposited on the inner surface of the bulb. Furthermore, if this floating carbon is adsorbed on the tip of the cathode or anode, on which tungsten comes into direct contact with the arc, vaporization at this adsorption site is accelerated even more.

This is because the tungsten carbide has a lower melting point than tungsten and therefore vaporizes more rapidly. This vaporization of the material which comprises the electrodes on the electrode tips leads to considerable attenuation of the amount of radiated light.

SUMMARY OF THE INVENTION

Therefore, a primary object of the present invention is to devise a mercury lamp in which carbon is advantageously eliminated as an impurity.

It is a further object of the present invention to provide a mercury lamp which has a high degree of maintenance of irradiance while eliminating the above-mentioned deficiencies of the prior art lamps.

These objects are achieved in a mercury lamp of the short arc type in which an anode and a cathode are disposed within an arc tube that is filled at least with mercury and rare gas by the cathode containing thorium oxide and having a tungsten carbide layer on its surface, except for the foremost tip region, and by at least one of the cathode or anode being provided with metallic tantalum, and by the condition $1.56 \leq VT/SC$ being satisfied, where SC is the area of the tungsten carbide layer ($cm^2$) and VT is the volume of the metallic tantalum ($mm^3$).

In the invention, there is a given amount of tantalum as the getter in order to advantageously capture carbon, if the carbon contained in the tungsten carbide which is located on the outer surface of the cathode sprays into the emission space in the bulb.

As was described above, the carbon contained in the tungsten carbide of the cathode decreases over the duration of lamp operation. The amount of carbon which is contained in the tungsten carbide of the cathode coating is conventionally 1 mg to a few mg. However, in accordance with the invention, because at least one of the cathode and anode is provided with tantalum, the carbon which is transported within the bulb by convection, and carbon monoxide, which is formed by combination with the gaseous contamination oxygen, can be advantageously adsorbed.

In lamp operation, vigorous convection occurs in the bulb and leads upward along the two electrodes if the lamp is vertical with respect to ground. Therefore, it is desirable to fix the attachment site of the tantalum as the getter also with respect to this convection.

In a mercury lamp of the short arc type in which an anode and a cathode are located within an arc tube that is filled at least with mercury and rare gas, and having a tungsten carbide layer on its surface, except for the foremost tip region, and at least one of the cathode or anode being provided with metallic tantalum, the above objects are, furthermore, achieved by fulfillment of the condition $0.043 \leq VT/VW$, where VW is the volume of the anode ($cm^3$) and VT is the volume of the metallic tantalum ($mm^3$).

In the invention, there is a given amount of tantalum in order to advantageously capture carbon if the carbon contained in the tungsten of the anode sprays into the emission space in the bulb during lamp operation.

The anode conventionally has a larger volume than the cathode because the thermal load exerted on the anode is greater than the thermal load exerted on the cathode. This means that the carbon contained in the tungsten of the cathode need not be considered to a large degree, because the cathode has a small volume, while this consideration is a good idea in the anode because the anode has a large volume.

If, during operation of the lamp, the body of the anode is exposed to a high temperature of, for example. 1500° C. to 2000° or 2000 plus a few hundred degrees Centigrade, the carbon sprays more frequently into the emission space.

These and further objects, features and advantages of the present invention will become apparent from the following description when taken in connection with the accompanying drawings which, for purposes of illustration only, show several embodiments in accordance with the present invention.

BRIEF DESCRIPTION OF THE DRAWINGS

FIG. 4 is a graph depicting the results of an experiment with respect to the relation between the area of the tungsten carbide and the tantalum volume; and FIG. 5 is a graph depicting the results of an experiment with respect to the relation between the anode volume and the tantalum volume.

DETAILED DESCRIPTION OF THE PREFERRED EMBODIMENT

Figure 1:
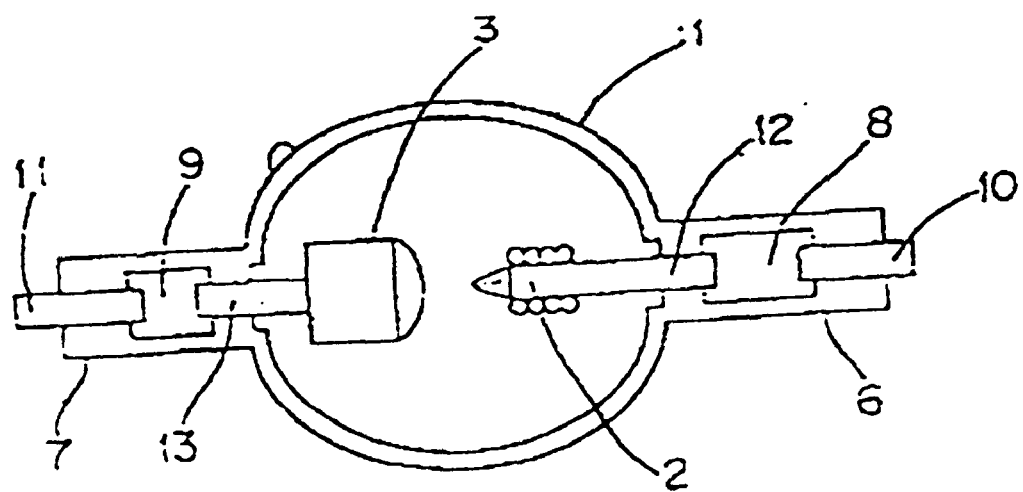
FIG. 1 is a schematic view of a mercury lamp of the short arc type in accordance with the present invention.

FIG. 1 is a schematic cross section of mercury lamp of the short arc type of the invention. In the drawing, a quartz arc tube 1 is shown which contains a cathode 2 and an anode 3, which are located opposite one another and which are respectively connected to foil part 8 and foil part 9 via an inner lead component 12 and inner lead component 13 within a hermetically sealed portion 6 and hermetically sealed portion 7, respectively. Outer lead components 10 and 11 are connected to the foil parts 8 and 9, respectively.
(Embodiment 1)

Figure 2:
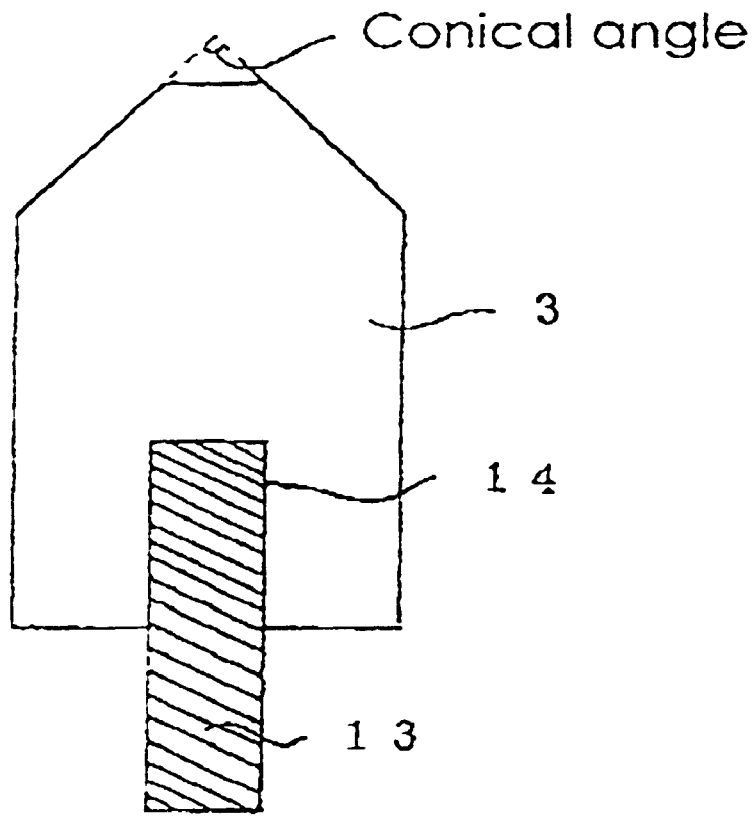
FIG. 2 shows an exterior view of the anode of the mercury lamp of the short arc of FIG. 1.
Figure 3:
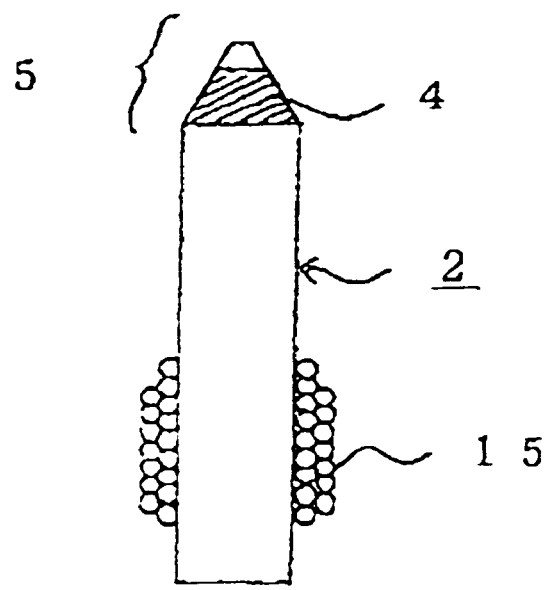
FIG. 3 is an exterior view of the cathode of the mercury lamp of the short arc type of FIG. 1.

FIG. 2 is an exterior view of the anode and FIG. 3 is an exterior view of the cathode. The quartz glass arc tube 1 has an essentially spherical shape with an outside diameter of roughly 55 mm. Cathode 2 is made of tungsten, has a tip diameter of 1.0 mm, a conical angle of 40° and a body diameter of 6 mm, and contains roughly 2% by weight thorium oxide. Anode 3 also is made of tungsten and has a conical angle of 90 degrees, a diameter of the plane of the tip of 5 mm, a body diameter of 20 mm and a total length of 30 mm.

Cathode 2 and anode 3 are located opposite one another within arc tube 1 at a distance of 4.0 mm. Arc tube 1 is filled with 4.5 mg/cc unit volume of mercury and 2 atm of Xe at room temperature. In cathode 2, proceeding from a point of conical part 5 at a distance of 3 mm from its tip in the direction toward the body, a tungsten carbide coating 4 is formed having an area of roughly 0.25 $cm^2$. Tungsten carbide coating 4 is produced as follows:

Fine carbon particles and butyl acetate are mixed, stirred and applied to the cathode which is kept for about 1 hour in a vacuum oven with a high temperature of roughly 1800° C. and heat treated. The thickness of the tungsten carbide coating 4 is roughly 50 microns.

In this way, tungsten carbide 4 is formed on the surface of the cathode 2, with the exception of the end portion of the tip area.

For anode 3, a portion of carbon has been removed by exposing it in a vacuum furnace to a high temperature of about 2500° C. for approximately 50 hours.

It goes without saying that the numerical values above are only given by way of example and that other numerical values can, therefore, also be used.

Next, using mercury lamps with the above described specification, an experiment was performed which describes the action of the invention.

First, a lamp A1 which is a mercury lamp with the above described specification and in which there is no tantalum present was produced.

Next, the amount of tantalum with which the cathode was wound was changed and thus seven different mercury lamps, A2 through A8, were produced. In these lamps, A1 through A8, all other conditions were the same.

In lamps A2 through A8, the tantalum with which the cathode was wound was produced as follows:

Strip-shaped tantalum with a diameter of 0.05 mm was cut to a given length. By leaving it in a vacuum high temperature furnace at approximately 2000° C. for about 30 minutes, degassing was performed. The given length of the tantalum for the lamps A2 through A8 is 20 mm, 100 mm, 200 mm, 500 mm, 1000 mm, 2000 mm, and 5000 mm, respectively.

Cathode 2 was wound with tantalum proceeding from a point at a distance of 10 mm from its tip in the direction toward the base point, as is indicated in FIG. 3 with reference number 15. It goes without saying that winding was performed repeatedly with tantalum with a large winding length.

Table 1 shows the amount of tantalum/$cm^2$ of tungsten carbide layer for lamps A1 through A8. This shows that this numerical value becomes larger, the greater the amount of tantalum with which winding was performed.

TABLE 1

| Lamp no. | Length of Ta (mm) | Ta volume per unit of area of carbide ($mm^3/cm^2$) |
| --- | --- | --- |
| A1 | no tantalum | — |
| A2 | 20 | 0.16 |
| A3 | 100 | 0.78 |
| A4 | 200 | 1.56 |
| A5 | 500 | 3.89 |
| A6 | 1000 | 7.78 |
| A7 | 2000 | 15.6 |
| A8 | 5000 | 38.8 |

The lamps A1 through A8 were operated by means of a constant current source with an input power of roughly 1500 W, the lamp voltage being 23.1 V and the lamp current being 63 A. The lamps were operated in a vertical lamp orientation relative to the ground, in which the cathode is pointed up.

The degree to which the irradiance was maintained for the horizontal was measured as follows:

The mercury lamps of the short arc type were kept vertical. At one point with a horizontal distance of 50 cm from the cathode tip, there was a bandpass filter which has the characteristic of passing UV light with a wavelength of 365 nm±5 nm. Directly behind this filter was a silicon photodiode attached as a photodetermination component and the irradiance was measured 1000 hours after the start of lamp operation.

Table 2 shows the result. Here, it is shown that lamp A1 without tantalum has a 70% degree of maintenance of irradiance, while the lamps with tantalum (A2 through A8) maintain an irradiance which is greater than or equal to 70%. If the tantalum volume/cm$^2$ of the tungsten carbide layer is greater than 3.89 (mm$^3$/cm$^2$), an irradiance of at least 90% is maintained. Furthermore, it was confirmed that, in lamps with tantalum, electrode damage occurs much less often than in the lamp without tantalum, and that electrode damage occurs less, the greater the tantalum volume/cm$^2$ of tungsten carbide layer.

The degree to which irradiance is maintained, however, was not greater than or equal to 93%, i.e., there was a tendency to saturation here even if the tantalum volume/cm$^2$ of tungsten carbide layer was increased. It can be imagined that the reason for this was that pure tungsten was vaporized from the anode tip. FIG. 4 is a graph of the results shown in Table 2. Here, the Y-axis is the degree to which the irradiance of the i-line is maintained and the X-axis is the tantalum volume/cm$^2$ of the tungsten carbide layer.

TABLE 2

| Lamp no. | Ta volume per unit of area of carbide (mm$^3$/cm$^2$) | Degree to which irradiance is maintained (%) |
|---|---|---|
| A1 | — | 70 |
| A2 | 0.16 | 70 |
| A3 | 0.78 | 71 |
| A4 | 1.56 | 75 |
| A5 | 3.89 | 85 |
| A6 | 7.78 | 91 |
| A7 | 15.6 | 92 |
| A8 | 38.8 | 93 |

Here, a case was considered effective in which the degree to which the relative irradiance of the i-line was maintained compared to the lamp without tantalum, i.e., lamp A1, was increased by at least 5%. An increase of the degree of maintenance by 5% for 1000 hours of lamp operation means an increase of the radiation energy of the i-line by roughly 5%; this corresponds to an increase of the throughput by 5% relative to this operation duration.

Generally, it is maintained that an increase of the radiation energy by 4% greatly improves the so-called throughput in the exposure process in semiconductor manufacture. It can therefore be stated that, at a tantalum volume/cm$^2$ of tungsten carbide layer of at least 1.56 (mm$^3$/cm$^2$), an action was obtained for increasing the degree to which irradiance is maintained.

(Embodiment 2)

In the following, an experiment pertaining to the relation between the anode volume and the tantalum volume is described. Here, mercury lamps without a tungsten carbide layer were produced, lamp B1 having no tantalum, while in lamps B2 through B8, each cathode is wound with a tantalum wire with a diameter of 0.05 mm, as in embodiment 1, the length of the tantalum wire having been 20 mm, 50 mm, 100 mm, 500 mm, 1000 mm, 5000 mm, and 10000 mm.

The anode volume in all lamps was the same, and in this test example, was roughly 4.56 cm$^3$. The exterior layer of the anode is shown in FIG. 2. Here, the volume of cavity 14 of the anode in which inner lead component 13 is inserted, compared to the total anode volume, is extremely small, and therefore, negligible. The anode volume was therefore reasonably determined without subtracting the volume of this cavity 14.

Table 3 shows the tantalum volume/cm$^3$ of anode for lamps B1 through B8. This table shows that this value is greater, the greater the amount (volume) of the tantalum with which winding is performed, because the anode volume is the same.

TABLE 3

| Lamp no. | Length of Ta (mm) | Ta volume with respect to the anode volume (mm$^3$/cm$^3$) |
|---|---|---|
| B1 | no tantalum | — |
| B2 | 20 | 0.0086 |
| B3 | 50 | 0.022 |
| B4 | 100 | 0.043 |
| B5 | 500 | 0.22 |
| B6 | 1000 | 0.43 |
| B7 | 5000 | 2.15 |
| B8 | 10000 | 4.30 |

The degree to which irradiance was maintained was measured in these lamps B1 through B8. The same methods as in embodiment 1 were used. Table 4 shows the results. In the measurements, the lamp voltage was 23.1 V and the lamp current was 65 A. The respective lamps were operated under the same conditions. Here, the degree to which irradiance of the respective lamps was maintained after 1000 hours of operation is shown.

This result shows that, in lamp B1 without winding with tantalum, the irradiance after 1000 hours of operation was reduced to 70%, while for the other lamps which were wound with tantalum greater irradiance was maintained. This shows that for mercury lamps which have been wound with tantalum a high irradiance can be maintained in this way because the carbon sprayed from the anode can be removed by this tantalum.

TABLE 4

| Lamp no. | Ratio of volume of Ta to anode volume (mm$^3$/cm$^3$) | Degree to which irradiance is maintained (%) |
|---|---|---|
| B1 | — | 70 |
| B2 | 0.0086 | 71 |
| B3 | 0.022 | 72 |
| B4 | 0.043 | 75 |
| B5 | 0.22 | 86 |
| B6 | 0.43 | 90 |
| B7 | 2.15 | 93 |
| B8 | 4.30 | 93 |

FIG. 5 is a schematic of the results shown in Table 4. As was described above, it can be ascertained that an action was obtained by removing the carbon to a sufficient degree if the degree to which the irradiance of the i-line is maintained is increased by at least 5%. This means that it can be stated that, in this experiment, an action can be confirmed when the tantalum volume/cm$^3$ of anode is greater than or equal to 0.043.

Attachment of the tantalum is not limited to winding of a strip-shaped tantalum. The tantalum can be attached in various ways, such as in a plate form, foil form, or in the form of a sintered body of tantalum particles and the like, in which the action of removing carbon can be obtained with each of these forms.

Furthermore, the attachment site of the tantalum is not limited to the cathode; instead, it can be attached to the anode, or it can also be attached to both the cathode and anode. In the case in which the cathode or the anode is supported by an inner lead pin, tantalum can also be attached to this inner lead pin.

Furthermore, the action of removing the carbon to a sufficient degree can be obtained even if its surface area is small with respect to the emission space, as in the case of helical winding with tantalum, because vigorous convection arises in the bulb, as was described above. But, it is not desirable that tantalum be attached in the foremost region of the cathode or anode because there it is exposed to a high temperature. Specifically, it is desirable that tantalum be attached at a location which is 5 mm to 15 mm from the tip of the cathode or anode.

A tantalum volume of 1 $mm^3$ corresponds to roughly 16 mg. Therefore, the tantalum can also be ascertained by this conversion into weight if a measurement based on volume is not possible.

Action of the Invention

As was described above, in a mercury lamp of the short arc type, the carbon emitted from the tungsten carbide can be advantageously removed if the tantalum volume/$cm^2$ of the tungsten carbide in the tip area of the cathode is at least 1.56 ($mm^3$). In this way, damage to the electrodes and blackening of the bulb can be advantageously suppressed. By suppression thereof, the irradiance can be adequately maintained.

In addition, by attaching tantalum of at least 0.043 $mm^3$/$cm^3$ on the anode, the carbon emitted from the anode can be advantageously removed. Thus, likewise, damage to the electrodes and blackening of the bulb can be advantageously suppressed, and thus, the irradiance can be sufficiently maintained.

What we claim is:

1. Mercury lamp of the short arc type in which an anode and a cathode are located within an arc tube that is filled at least with mercury and rare gas; wherein the cathode contains thorium oxide and has a tungsten carbide layer on an exterior surface thereof, except at a tip end portion thereof; wherein at least one of the cathode and the anode is provided with metallic tantalum; and wherein a relationship $1.56 \leq VT/SC$ is satisfied, where SC is an area of the tungsten carbide layer ($cm^2$) and VT is a volume of the metallic tantalum ($mm^3$).

2. Mercury lamp of the short arc type according to claim 1, wherein said tip end portion extends about 3 mm from a tip of the cathode toward a body thereof.

3. Mercury lamp of the short arc type according to claim 1, wherein the tantalum is attached at a location which is about 5 to 15 mm from a tip of said at least one of the cathode and anode.

4. Mercury lamp of the short arc type according to claim 1, wherein said tantalum is provided by one of strip-shaped, plate-shaped, foil-shaped, and sintered tantalum.

5. Mercury lamp of the short arc type according to claim 1, wherein said tantalum is attached on a lead component of said at least one of the cathode and anode.

6. Mercury lamp of the short arc type in which an anode and a cathode are located within an arc tube that is filled at least with mercury and rare gas; wherein at least one of the cathode and the anode is provided with metallic tantalum; and wherein a condition $0.043 \leq VT/VW$ is satisfied, in which VW is a volume of the anode ($cm^3$) and VT is a volume of the metallic tantalum ($mm^3$).

7. Mercury lamp of the short arc type according to claim 6, wherein the tantalum is attached at a location which is 5 mm to 15 mm from a tip of said at least one of the cathode and anode.

8. Mercury lamp of the short arc type according to claim 6, wherein said tantalum is provided by one of strip-shaped, plate-shaped, foil-shaped, and sintered tantalum.

9. Mercury lamp of the short arc type according to claim 6, wherein said tantalum is attached on a lead component of said at least one of the cathode and anode.

* * * * *